US011195923B2

(12) United States Patent
Thareja et al.

(10) Patent No.: US 11,195,923 B2
(45) Date of Patent: Dec. 7, 2021

(54) METHOD OF FABRICATING A SEMICONDUCTOR DEVICE HAVING REDUCED CONTACT RESISTANCE

(71) Applicant: Applied Materials, Inc., Santa Clara, CA (US)

(72) Inventors: Gaurav Thareja, Santa Clara, CA (US); Xuebin Li, Sunnyvale, CA (US); Abhishek Dube, Fremont, CA (US); Yi-Chiau Huang, Fremont, CA (US); Tushar Vidyadhar Mandrekar, San Jose, CA (US); Andy Lo, Saratoga, CA (US); Patricia M. Liu, Saratoga, CA (US); Sanjay Natarajan, Portland, OR (US); Saurabh Chopra, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 16/678,526

(22) Filed: Nov. 8, 2019

(65) Prior Publication Data

US 2020/0203490 A1 Jun. 25, 2020

Related U.S. Application Data

(60) Provisional application No. 62/783,851, filed on Dec. 21, 2018.

(51) Int. Cl.
*H01L 21/44* (2006.01)
*H01L 29/40* (2006.01)
(Continued)

(52) U.S. Cl.
CPC ...... *H01L 29/401* (2013.01); *H01L 21/02063* (2013.01); *H01L 21/67184* (2013.01);
(Continued)

(58) Field of Classification Search
CPC .................. H01L 29/66696; H01L 29/66727
(Continued)

(56) References Cited

U.S. PATENT DOCUMENTS 5,976,976 A 11/1999 Doan et al.
6,130,145 A 10/2000 Ilg et al.
(Continued)

OTHER PUBLICATIONS

Office Action for Tawiwan Application No. 108141095 dated Jan. 29, 2021.
(Continued)

*Primary Examiner* — Calvin Lee
(74) *Attorney, Agent, or Firm* — Patterson + Sheridan, LLP (57) ABSTRACT

Implementations of the present disclosure generally relate to methods for forming a transistor. More specifically, implementations described herein generally relate to methods for forming a source/drain contact. In one implementation, the method includes forming a trench in a dielectric material to expose a source/drain region of a transistor, performing a pre-clean process on the exposed source/drain region, forming a doped semiconductor layer on the source/drain region by an epitaxial deposition process, and fill the trench with a conductor. The doped semiconductor layer has a lower electrical resistance than the source/drain region due to a higher dopant concentration in the doped semiconductor layer. As a result, the contact resistance of the source/drain contact is reduced.

13 Claims, 6 Drawing Sheets

(51) Int. Cl.
*H01L 29/417* (2006.01)
*H01L 21/02* (2006.01)
*H01L 29/08* (2006.01)
*H01L 21/67* (2006.01)
*H01L 29/66* (2006.01)
*H01L 21/285* (2006.01)
*H01L 29/45* (2006.01)

(52) U.S. Cl.
CPC .... *H01L 21/67207* (2013.01); *H01L 29/0847* (2013.01); *H01L 29/41791* (2013.01); *H01L 29/66696* (2013.01); *H01L 29/66727* (2013.01); *H01L 21/28518* (2013.01); *H01L 21/28575* (2013.01); *H01L 29/45* (2013.01); *H01L 29/452* (2013.01); *H01L 29/456* (2013.01)

(58) Field of Classification Search
USPC ......... 257/736, 774, 781; 438/334, 614, 675
See application file for complete search history.

(56) References Cited

U.S. PATENT DOCUMENTS

| | | | |
|---|---|---|---|
| 6,645,870 B2 * | 11/2003 | Negishi | H01L 21/02063 438/710 |
| 7,732,269 B2 | 6/2010 | Kim et al. | |
| 7,960,236 B2 | 6/2011 | Chopra et al. | |
| 7,964,500 B2 * | 6/2011 | Futase | H01L 21/76855 438/655 |
| 9,059,024 B2 | 6/2015 | Glass et al. | |
| 9,177,820 B2 | 11/2015 | Bergendahl et al. | |
| 9,362,285 B2 * | 6/2016 | Basker | H01L 29/161 |
| 9,385,130 B2 * | 7/2016 | Fukushima | H01L 27/10814 |
| 9,401,417 B2 * | 7/2016 | Chen | H01L 29/401 |
| 9,853,129 B2 | 12/2017 | Bauer et al. | |
| 9,893,189 B2 | 2/2018 | Colinge et al. | |
| 10,128,337 B2 | 11/2018 | Zhou et al. | |
| 10,340,355 B2 * | 7/2019 | Adusumilli | H01L 21/76882 |
| 2005/0167394 A1 | 8/2005 | Liu et al. | |
| 2007/0077524 A1 | 4/2007 | Koh et al. | |
| 2007/0196011 A1 | 8/2007 | Cox et al. | |
| 2009/0004875 A1 | 1/2009 | Shen et al. | |
| 2010/0002767 A1 | 11/2010 | Tung et al. | |
| 2010/0291713 A1 | 11/2010 | Lee et al. | |
| 2014/0000015 A1 | 1/2014 | Glass et al. | |
| 2014/0000088 A1 | 1/2014 | Emesh | |
| 2014/0000658 A1 | 3/2014 | Ahmed et al. | |
| 2014/0134814 A1 | 5/2014 | Wong et al. | |
| 2015/0000448 A1 | 2/2015 | Wang et al. | |
| 2015/0151329 A1 | 6/2015 | Kawanishi et al. | |
| 2016/0020301 A1 | 1/2016 | Park et al. | |
| 2016/0071956 A1 | 3/2016 | Balakrishnan et al. | |
| 2016/0211352 A1 | 7/2016 | Chuang et al. | |
| 2016/0003294 A1 | 11/2016 | Glass et al. | |
| 2017/0047419 A1 | 2/2017 | Glass et al. | |
| 2017/0221894 A1 | 8/2017 | Liu et al. | |
| 2017/0003527 A1 | 12/2017 | Yang et al. | |
| 2017/0352531 A1 | 12/2017 | Dube et al. | |
| 2018/0145140 A1 | 5/2018 | Lin et al. | |
| 2018/0001665 A1 | 6/2018 | Colinge et al. | |
| 2018/0174913 A1 | 6/2018 | More et al. | |
| 2020/0312842 A1 * | 10/2020 | Keech | H01L 24/17 |

OTHER PUBLICATIONS

Office Action for Tawiwan Application No. 108141095 dated Aug. 10, 2021.

* cited by examiner

METHOD OF FABRICATING A SEMICONDUCTOR DEVICE HAVING REDUCED CONTACT RESISTANCE

CROSS-REFERENCE TO RELATED APPLICATIONS

This application claims priority to U.S. Provisional Patent Application Ser. No. 62/783,851, filed on Dec. 21, 2018, which herein is incorporated by reference.

BACKGROUND

Field

Implementations of the present disclosure generally relate to methods for forming a transistor. More specifically, implementations described herein generally relate to methods for forming a source/drain contact.

Description of the Related Art

A key challenge in semiconductor design, manufacture, and operation is contact resistance. For example, the source and drain regions of a Fin Field-Effect Transistor (FinFET) device may be eroded by the etch process for forming the source/drain contact trench, leading to increased contact resistance. A result of increased contact resistance is decreased performance of circuit devices including transistors and other device structures formed on a semiconductor substrate.

There is a need for semiconductor processing methods for forming a transistor having decreased contact resistance.

SUMMARY

Implementations of the present disclosure generally relate to methods for forming a transistor. More specifically, implementations described herein generally relate to methods for forming a source/drain contact. In one implementation, a method for forming a contact includes forming a trench in a dielectric material to expose a source/drain region, performing a pre-clean process on the source/drain region, forming a doped semiconductor layer on the source/drain region, and filling the trench with a conductor.

In another implementation, a semiconductor device includes a source/drain region extending from a semiconductor structure, a doped semiconductor layer disposed on a first portion of the source/drain region, a metal silicide layer disposed on the doped semiconductor layer, a cap layer disposed on the metal silicide layer, and a conductor disposed on the cap layer.

In another implementation, a process system includes a first transfer chamber, a plurality of process chambers coupled to the first transfer chamber, and a controller configured to cause a process to be performed in the processing system that includes performing a pre-clean process on a source/drain region, forming a doped semiconductor layer on the source/drain region, and filling the trench with a conductor.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The present disclosure generally relate to methods for forming a transistor. More specifically, methods described herein generally relate to methods for forming a source/drain contact. In one implementation, which can include or be combined with one or more implementations described herein, the method includes forming a trench in a dielectric material to expose a source/drain region of a transistor, performing a pre-clean process on the exposed source/drain region, forming a doped semiconductor layer on the source/drain region by an epitaxial deposition process, and fill the trench with a conductor. The doped semiconductor layer has a lower electrical resistance than the source/drain region due to a higher dopant concentration in the doped semiconductor layer. As a result, the contact resistance of the source/drain contact is reduced.

The foregoing broadly outlines techniques described in this disclosure. It is contemplated that the concepts of the present disclosure may be implemented for a planar transistor device or for a three-dimensional transistor device, such as fin field effect transistors (FinFETs), horizontal gate all around (HGAA) FETs, vertical gate all around (VGAA) FETs, nanowire channel FETs, strained-semiconductor devices, etc.

Figure 1:
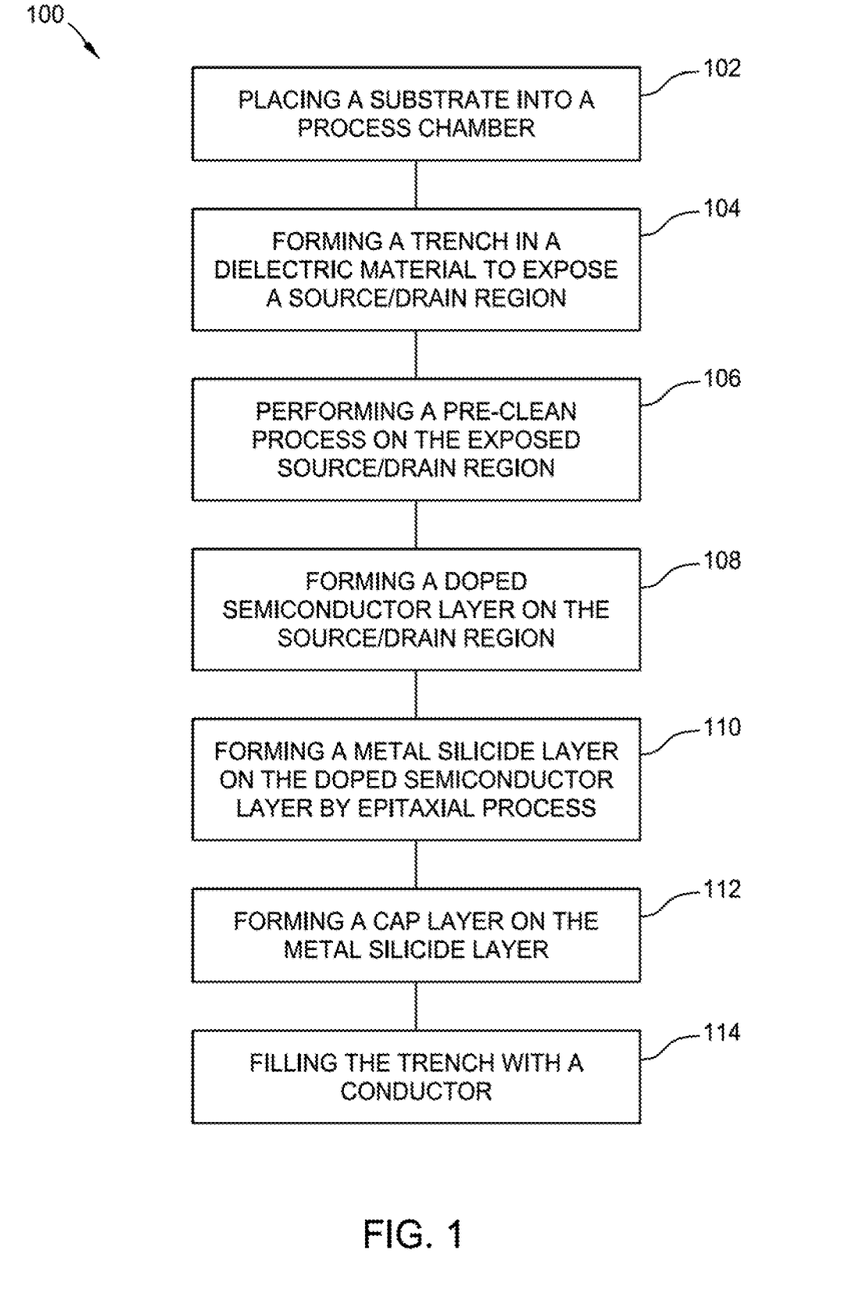
FIG. 1 is a flow diagram of a method for forming a contact.

FIG. 1 is a flow diagram of a method 100 for forming a contact. FIGS. 2A-2G illustrate various views of a transistor during different stages of the method 100 of FIG. 1. It is noted that the method 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of steps is implied. Operations depicted or described as sequential are, unless explicitly specified, merely done so for purposes of explanation without precluding the possibility that the respective steps are actually performed in concurrent or overlapping manner, at least partially if not entirely.

Figure 2A:
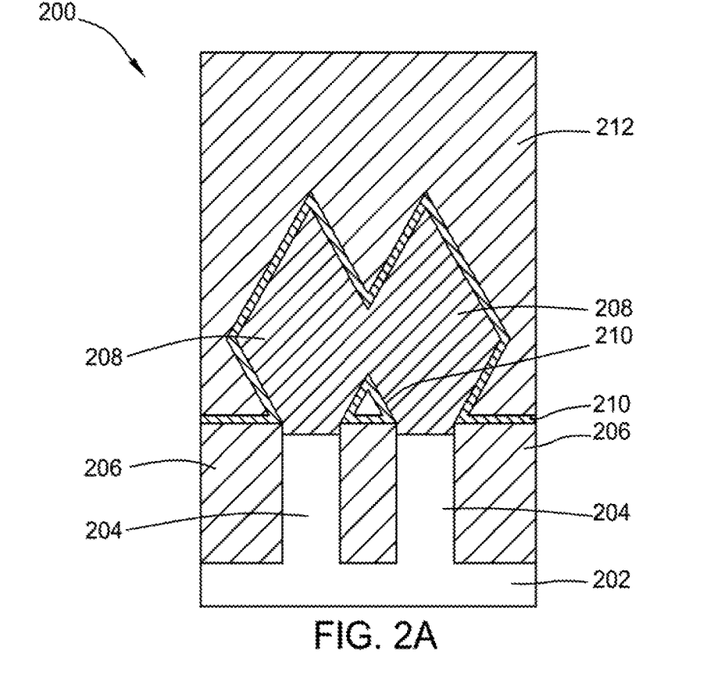
FIGS. 2A-2G illustrate various views of a transistor during different stages of the method of FIG. 1.

The method 100 starts at operation 102 by placing a substrate 200 into a process chamber. The process chamber may be an etch chamber. As shown in FIG. 2A, the substrate 200 includes a semiconductor layer 202, a plurality of semiconductor structures 204 (only two are shown) extending from the semiconductor layer 202, and a dielectric material 206 disposed between the semiconductor structures 204 on the semiconductor layer 202. The semiconductor structures 204 may be semiconductor fins. The semiconductor layer 202 is fabricated from silicon, germanium, silicon germanium, or group III/V compound semiconductors, such as GaAs or InGaAs. The semiconductor layer 202 may be doped with a p-type or an n-type dopant. In one implementation, which can include or be combined with one or more implementations described herein, the semiconductor layer 202 is doped with a p-type dopant, such as boron. In one implementation, which can include or be combined with one or more implementations described herein, the semiconductor layer 202 is doped with an n-type dopant, such as phosphorus or arsenic. The semiconductor structures 204 are fabricated from the same material as the semiconductor layer 202. In one implementation, which can include or be combined with one or more implementations described herein, the semiconductor structures 204 are integral with the semiconductor layer 202. The dielectric material 206 may be the shallow trench isolation (STI) regions, and may be fabricated from SiO, SiN, SiCN, or other suitable dielectric material.

The substrate 200 further includes a source/drain region 208 extending from each semiconductor structures 204. In one implementation, which can include or be combined with one or more implementations described herein, the source/drain region 208 is a source region or a drain region. In one implementation, which can include or be combined with one or more implementations described herein, the source/drain region 208 includes a merged source and drain region 208, as shown in FIG. 2A. In either implementation, the source/drain region 208 is fabricated from a semiconductor material that is grown epitaxially on the semiconductor structures 204. The source/drain region 208 is fabricated from silicon, germanium, silicon-germanium, or group III/V compound semiconductors, such as GaAs, InGaAs. The source/drain region 208 may be doped with a p-type or an n-type dopant. In one example, the source/drain region 208 is doped with a p-type dopant, such as boron. Alternatively, the source/drain region 208 is doped with an n-type dopant, such as phosphorus or arsenic. The source/drain region 208 may be grown epitaxially on the semiconductor structure 204, and because of the different growth rate on different surface planes, facets may be formed to cause the source/drain region 208 to have a diamond shape.

Contact etch stop layers (CESL) 210 are formed on the dielectric material 206 and the source/drain region 208. CESL 210 is fabricated from a dielectric material, such as silicon nitride, silicon oxynitride, silicon carbon nitride, or a combination thereof. A dielectric material 212 is disposed over the CESL 210. The dielectric material 212 may be the interlayer dielectric, and may be fabricated from a dielectric material, such as silicon oxide, silicon nitride, silicon oxynitride, silicon carbide, or a combination thereof. The substrate 200 may include a plurality of gates (not shown) disposed across the source/drain regions 208.

Figure 2B:
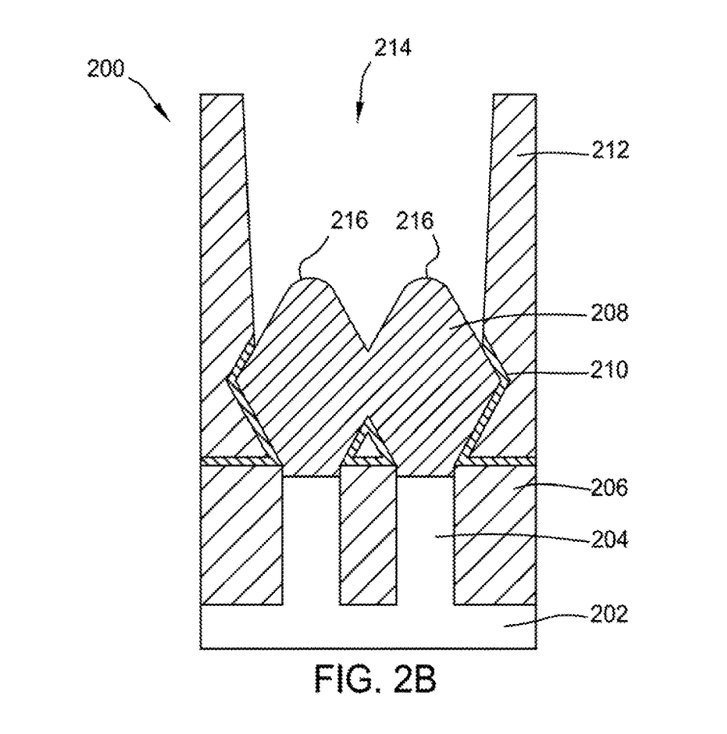

Next, at operation 104, a trench 214 is formed in the dielectric material 212 to expose each source/drain region 208, as shown in FIG. 2B. The trench 214 is formed by removing a portion of the dielectric material 212 and the CESL 210 disposed over each source/drain region 208, and a surface 216 of each source/drain region 208 is exposed. The trench 214 may be formed by any suitable removal process. In one example, the trench 214 is formed by a reactive ion etching (RIE) process. A single source or drain region 208 is exposed in each trench 214. Alternatively, a merged source and drain region 208 is exposed in each trench 214, as shown in FIG. 2B. A portion of the source/drain region 208 is removed during the formation of the trench 214. The eroded source/drain region 208 has an increased contact resistance. The trench 214 may be formed in a reactive ion etch (RIE) chamber or other suitable etch chamber.

Next, at operation 106, a pre-clean process is performed on the exposed surface 216 of the source/drain region 208. The pre-clean process is performed to remove contaminants, such as carbon or oxide contaminants, on the surface 216 of the source/drain region 208. The pre-clean process may be any suitable etch process, such as dry etch, wet etch, or a combination thereof. In one implementation, which can include or be combined with one or more implementations described herein, the pre-clean process includes a wet etch process followed by a dry etch process. The wet etch process may utilize ammonia or hydrogen fluoride solution. The dry etch process may be a plasma etch process and may utilize a fluorine or hydrogen containing etchant. The pre-clean process does not substantially remove any portion of the source/drain region 208.

The pre-clean process is performed in a first process chamber of a processing system. In one example, the pre-clean process is performed in a process chamber using a remote plasma source. One example process chamber suitable for performing the pre-clean process is an AKTIV Pre-Clean™ chamber or a SICONI® clean chamber available from Applied Materials, Inc., Santa Clara, Calif. Alternatively, the pre-clean process is performed in an etch chamber, such as an etch chamber using an inductively coupled plasma (ICP) source. One example etch chamber may be a modified Decoupled Plasma Nitridation (DPN) chamber that is available from Applied Materials Inc., Santa Clara, Calif. However, it is contemplated that other suitably configured chambers from other manufacturers may also be implemented to perform the pre-clean process.

Figure 2C:
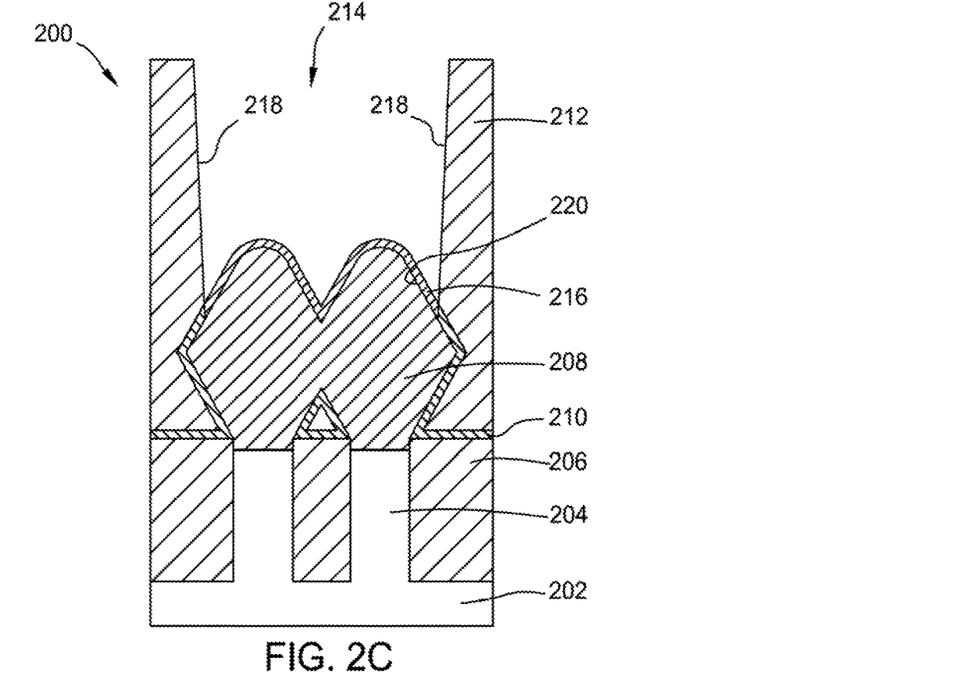

At operation 108, a doped semiconductor layer 220 is formed on the cleaned surface 216 of the source/drain region 208 after the pre-clean process that removes any contaminants from the surface 216, as shown in FIG. 2C. The doped semiconductor layer 220 may be formed by a selective epitaxial deposition process. The doped semiconductor layer 220 is formed on the surface 216, i.e., the bottom of the trench 214, and not on sidewalls 218 of the trench 214 as a result of the selective epitaxial deposition process. The selective epitaxial deposition process is performed while the substrate is maintained at a temperature of less than about 450 degrees Celsius. The doped semiconductor layer 220 may be fabricated from the same material as the source/drain region 208, with the exception that the dopant concentration in the doped semiconductor layer 220 is substantially higher than the dopant concentration in the source/drain region 208. For example, the doped semiconductor layer 220 is fabricated from germanium-tin (GeSn) in-situ doped with boron and gallium, silicon-germanium (SiGe) in-situ doped with boron, germanium (Ge) in-situ doped with boron and gallium, or silicon in-situ doped with phosphorous and arsenic. In one implementation, which can include or be combined with one or more implementations described herein, the doped semiconductor layer 220 is formed by a dopant soak process. During the dopant soak process, a top portion of the source/drain region 208, such as from the surface 216 to a predetermined depth, is converted to the doped semiconductor layer 220. For example, the surface 216 of the source/drain region 208 is exposed to one or more gases containing one or more dopants, such as gallium, boron, phosphorous, and arsenic, during the dopant soak process. The doped semiconductor layer 220 may have a thickness ranging from about few angstroms to about 10 nm. The dopant concentration in the source/drain region 208 is less than the dopant concentration in the doped semiconductor layer 220. Increased dopant concentration in the doped semiconductor layer 220 decreases contact resistance.

In one implementation, which can include or be combined with one or more implementations described herein, the doped semiconductor layer 220 is formed in the reduced pressure (RP) Epi chamber available from Applied Materials, Inc., Santa Clara, Calif. However, it is contemplated that other suitably configured chambers from other manufacturers may also be implemented to perform the selective epitaxial deposition or the dopant soak process to form the doped semiconductor layer 220.

Figure 2D:
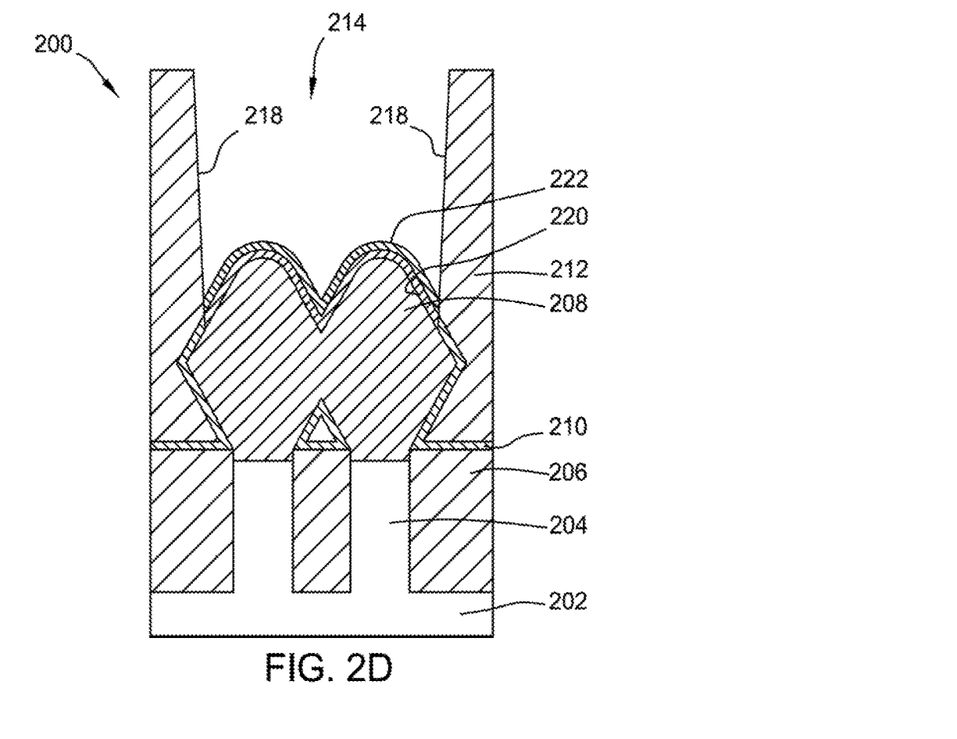

Next, at operation 110, a metal silicide layer 222 is formed on the doped semiconductor layer 220 by a selective epitaxial deposition process, as shown in FIG. 2D. The metal silicide layer 222 is formed on the doped semiconductor layer 220, i.e., the bottom of the trench 214, and not on sidewalls 218 of the trench 214 as a result of the selective epitaxial deposition process. The metal silicide layer 222 may be titanium silicide, cobalt silicide, ruthenium silicide, or other suitable metal silicide. The metal silicide layer 222 has a thickness ranging from few angstroms to about 10 nm. The metal silicide layer 222 may be formed in the same process chamber as the doped semiconductor layer 220.

Figure 2E:
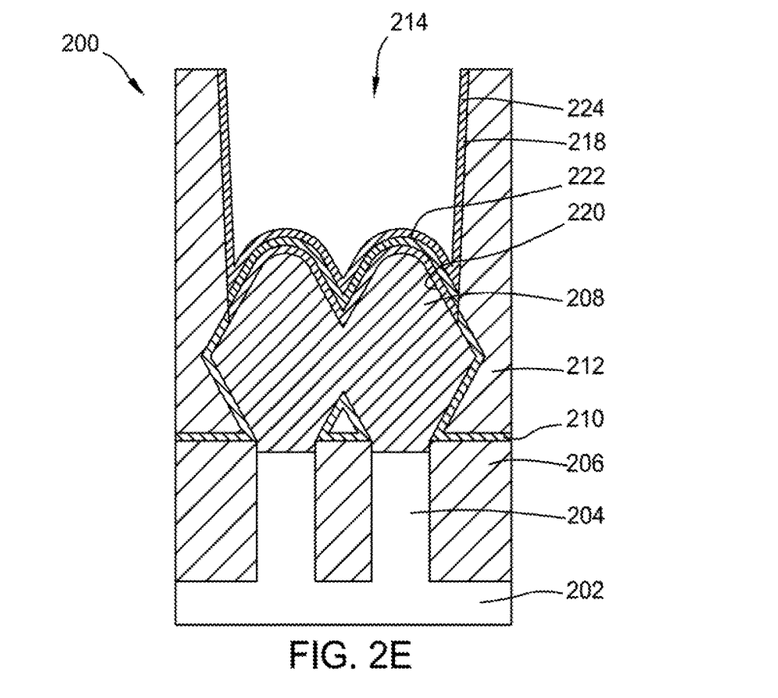

Next, at operation 112, a cap layer 224 is formed on the metal silicide layer 222, as shown in FIG. 2E. The cap layer 224 may be fabricated from a nitride or an oxide material, such as titanium nitride, silicon nitride, aluminum oxide, hafnium oxide, zirconium oxide, or manganese oxide. The cap layer 224 may be formed by an atomic layer deposition (ALD) process, and the cap layer 224 may be conformal, as shown in FIG. 2E. If the cap layer 224 is formed by the ALD process, the cap layer 224 is formed on both the sidewalls 218 and the metal silicide layer 222. The deposition of the cap layer 224 may be performed in an ALD chamber. One example of the ALD chamber is an OLYMPIA® ALD chamber available from Applied Materials, Inc., Santa Clara, Calif., although other suitable chambers may be utilized.

In some implementations, the cap layer 224 is formed by nitridating the metal silicide layer, and the cap layer 224 is a metal silicon nitride layer. The nitridation process may include exposing the metal silicide layer 222 to a nitrogen-containing plasma or a nitrogen-containing ambient environment so that nitrogen atoms chemically react with atoms residing at the exposed surface of the metal silicide layer 222 to form a surface nitride layer (e.g., the cap layer 224). The nitridation process may be performed in a plasma chamber using an inductively coupled plasma (ICP) source, such as the modified Decoupled Plasma Nitridation (DPN) chamber available from Applied Materials, Inc., Santa Clara, Calif., or other suitable chamber.

Figure 2F:
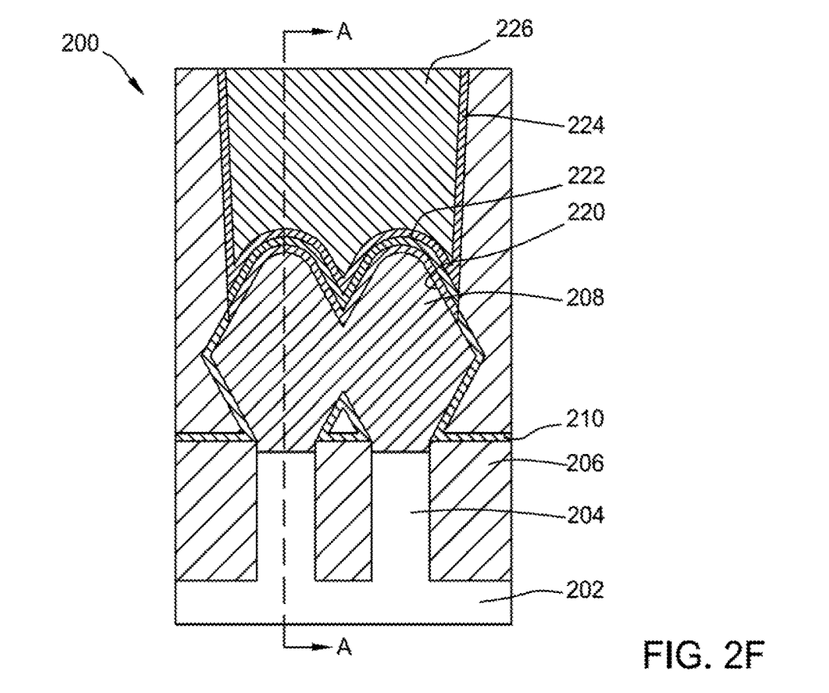

Next, at operation 114, a conductor 226 is formed in the trench 214 to fill the trench 214, as shown in FIG. 2F. The conductor 226 is fabricated from an electrically conductive material, such as a metal. In one example, the conductor 226 is fabricated from cobalt. The conductor 226 may be formed by one or more deposition processes. For example, the conductor 226 may be formed by first forming a seed layer and then a bulk fill on the seed layer. The seed layer and the bulk fill are fabricated from the same material. The conductor 226 may be formed by any suitable deposition method, such as chemical vapor deposition (CVD) or physical vapor deposition (PVD).

Figure 2G:
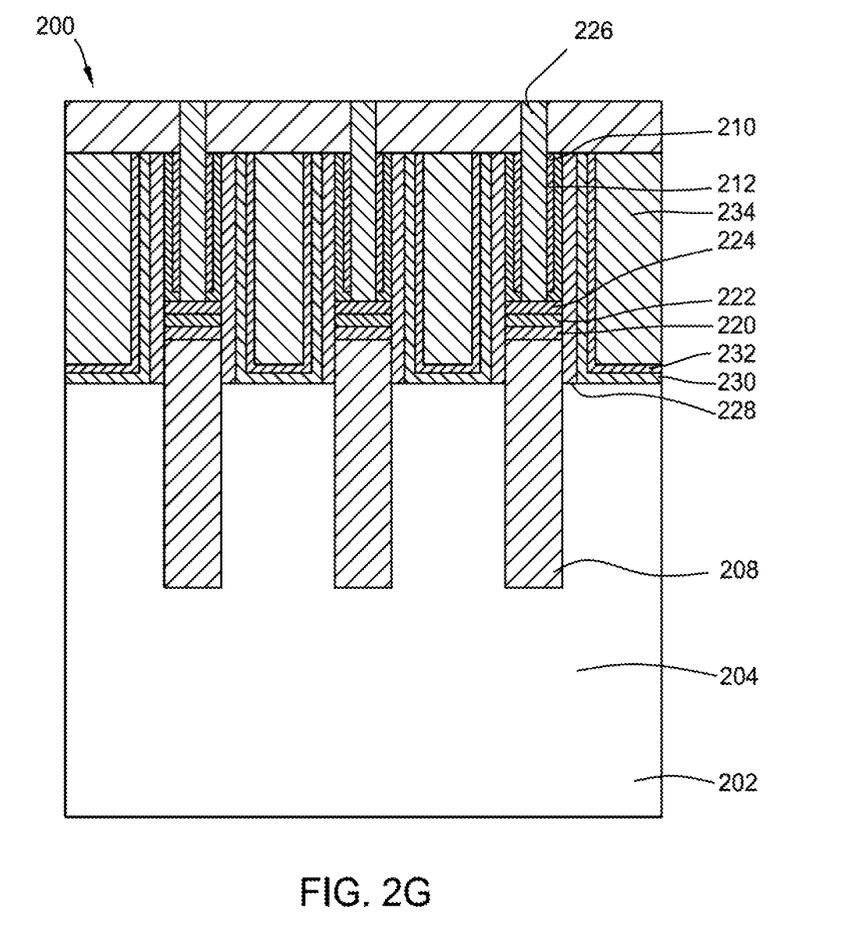

FIG. 2G is a cross sectional view of the substrate 200 at line A-A shown in FIG. 2F. As shown in FIG. 2G, the source/drain region 208 extends from the semiconductor structure 204. The doped semiconductor layer 220 is disposed on the source/drain region 208, the metal silicide layer 222 is disposed on the doped semiconductor layer 220, and the cap layer 224 is disposed on the metal silicide layer 222. The CESL 210 and the dielectric material 212 may be disposed over the source/drain region 208, such as on the cap layer 224, as shown in FIG. 2G. The adjacent source/drain regions 208 are separated by a conductor 234. The conductor 234 may function as the gate of a transistor. One or more layers may be disposed between the source/drain region 208 and the conductor 234. For example, as shown in FIG. 2G, a spacer 228, a dielectric layer 230, and a work function layer 232 are disposed between the source/drain region 208 and the conductor 234. The spacer 228 may be fabricated from a dielectric material, such as an oxide or a nitride. The dielectric layer 208 may be a high-K dielectric layer, such as hafnium oxide or titanium oxide. The work function layer 232 may be a nitride layer, such as titanium nitride.

Referring back to FIG. 1, operations 106, 108, 110, and 112 are performed to reduce contact resistance of a source/drain contact in a transistor. In some implementations, one or more operations of the operations 106, 108, 110, and 112 may be omitted while still achieving the reduced contact resistance.

In one implementation, which can include or be combined with one or more implementations described herein, operations 106 and 108 are performed, followed by operation 114 without performing operations 110 and 112. For example, after the doped semiconductor layer 220 is formed on the source/drain region 208, the conductor 226 is formed in the trench 214 and on the doped semiconductor layer 220.

In one implementation, which can include or be combined with one or more implementations described herein, operation 110 is performed after operation 104 without performing operations 106 and 108. For example, after the trench 214 is formed to expose the source/drain region 208, the metal silicide layer 222 is formed on the exposed source/drain region 208. Operations 112 and 114 are performed following the operation 110.

In one implementation, which can include or be combined with one or more implementations described herein, operation 110 is performed after operation 104 without performing operations 106 and 108, and operation 114 is performed after operation 110 without performing operation 112. For example, after the trench 214 is formed to expose the source/drain region 208, the metal silicide layer 222 is formed on the exposed source/drain region 208, and the conductor 226 is formed in the trench 214 and on the metal silicide layer 222.

Figure 3:
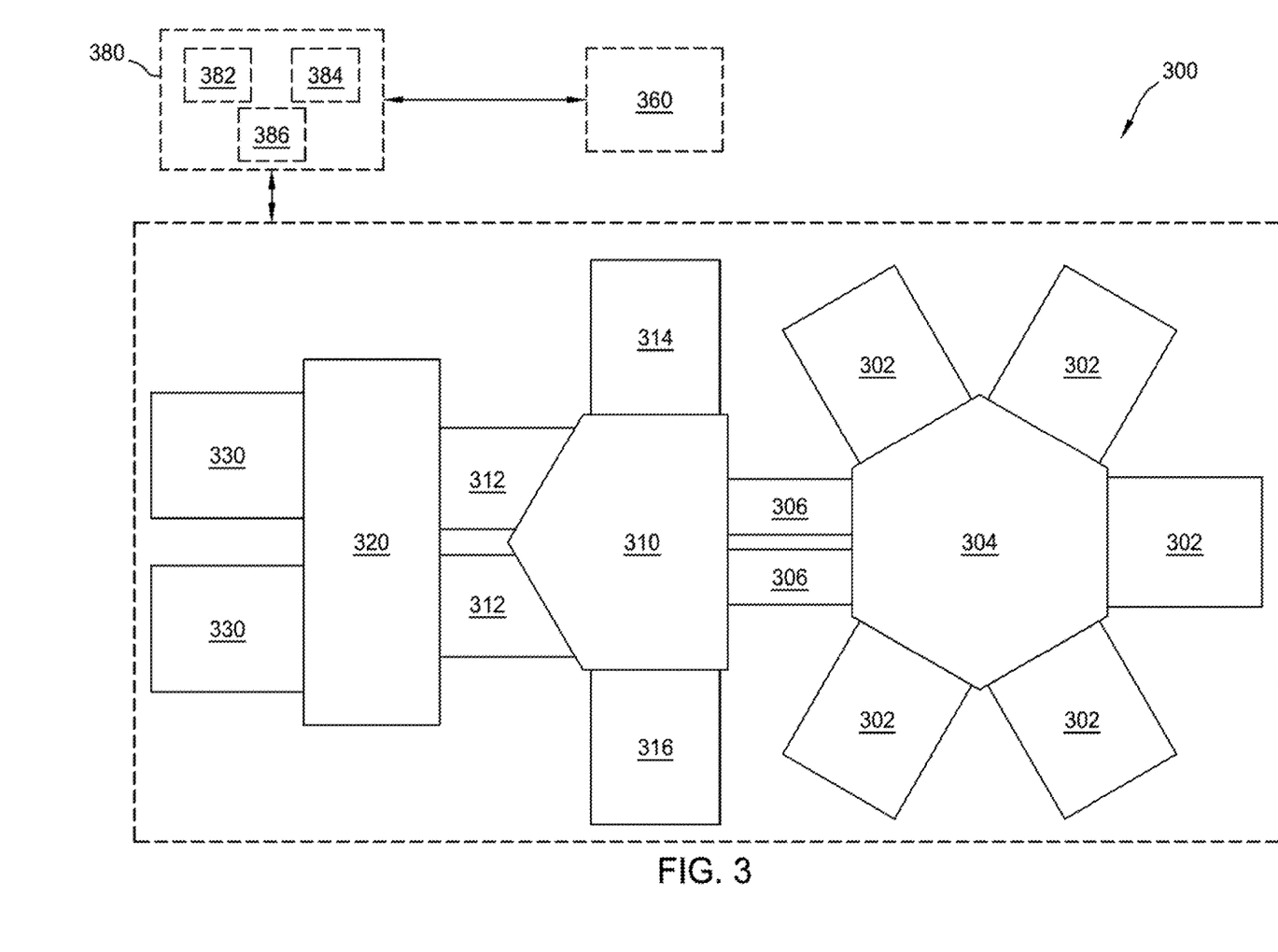
FIG. 3 is a schematic top-view diagram of an example multi-chamber processing system suitable for performing the method of FIG. 1.

Examples of a processing system that may be suitably modified in accordance with the teachings provided herein include the ENDURA®, PRODUCER® or CENTURA® integrated processing systems or other suitable processing systems commercially available from Applied Materials, Inc., located in Santa Clara, Calif. It is contemplated that other processing systems (including those from other manufacturers) may be adapted to benefit from aspects described herein. FIG. 3 illustrates a schematic top-view diagram of an example multi-chamber processing system 300 that can be used to complete the method 100 illustrated in FIG. 1, according to implementations of the present disclosure. As shown in FIG. 3, a plurality of process chambers 302 is coupled to a first transfer chamber 304. The first transfer chamber 304 is also coupled to a first pair of pass-through chambers 306. The first transfer chamber 304 has a centrally disposed transfer robot (not shown) for transferring substrates between the pass-through chambers 306 and the process chambers 302. The pass-through chambers 306 are coupled to a second transfer chamber 310, which is coupled to a process chamber 314 that is configured to perform pre-clean process (operation 106) and a process chamber 316 that is configured to perform a epitaxial deposition process (operations 108/110). The second transfer chamber 310 has a centrally disposed transfer robot (not shown) for transferring substrates between a set of load lock chamber 312 and the process chamber 314 or the process chamber 316. A factory interface 320 is connected to the second transfer chamber 310 by the load lock chambers 312. The factory interface 320 is coupled to one or more pods 330 on the opposite side of the load lock chambers 312. The pods 330 typically are front opening unified pods (FOUP) that are accessible from a clean room.

During operation, a substrate is first transferred to the process chamber 314 where a pre-clean process is performed to remove contaminant, such as carbon or oxide contaminant from exposed surface of a source/drain region of a transistor of the substrate. The contaminants removal process is described in FIG. 1 under operation 106. Then the substrate is transferred to the process chamber 316 where operations 108 and 110 are performed. In some implementations, the process chamber 314 and/or process chamber 316 can be switched with any of the one or more process chambers 302.

The substrate is then transferred to one or more process chambers 302 in which the operation 112 and the operation 114 are performed. Because all of the operations 106, 108, 110, 112, and are performed within the same processing system 300, vacuum is not broken as the substrate is transferred to various chambers, which decreases the chance of contamination and improves the quality of the deposited epitaxial film.

In some implementations, the substrate is provided to an etch chamber, which is not a part of the processing system that contains the process chambers 314, 316 and the one or more process chambers 302, to perform the trench formation process (operation 104). Once the trench is formed in the dielectric material, the substrate is then transferred to the pods 330. The substrate is then transferred to the process chamber 314 in which operation 106 is performed. Then the substrate is transferred to the process chamber 316 and at least one of the process chambers 302 where operations 108, 110, 112, and 114 are performed.

A system controller 380 is coupled to the processing system 300 for controlling the processing system 300 or components thereof. For example, the system controller 380 may control the operations of the processing system 100 using a direct control of the chambers 302, 304, 306, 310, 312, 314, 316, 320, 330 of the processing system 300 or by controlling controllers associated with the chambers 302, 304, 306, 310, 312, 314, 316, 320, 330, 360. In operation, the system controller 380 enables data collection and feedback from the respective chambers to coordinate performance of the processing system 300.

The system controller 380 generally includes a central processing unit (CPU) 382, memory 384, and support circuits 386. The CPU 382 may be one of any form of a general purpose processor that can be used in an industrial setting. The memory 384, non-transitory computer-readable medium, or machine-readable storage device, is accessible by the CPU 382 and may be one or more of memory such as random access memory (RAM), read only memory (ROM), floppy disk, hard disk, or any other form of digital storage, local or remote. The support circuits 386 are coupled to the CPU 382 and may comprise cache, clock circuits, input/output subsystems, power supplies, and the like. The system controller 380 is configured to perform method 100 stored in the memory 384. The various implementations disclosed in this disclosure may generally be implemented under the control of the CPU 382 by executing computer instruction code stored in the memory 384 (or in memory of a particular process chamber) as, e.g., a computer program product or software routine. That is, the computer program product is tangibly embodied on the memory 384 (or non-transitory computer-readable medium or machine-readable storage device). When the computer instruction code is executed by the CPU 382, the CPU 382 controls the chambers to perform operations in accordance with the various implementations.

In summary, implementations of the present disclosure enable formation of a source/drain contact with reduced contact resistance by using integrated processes, which allows various operations of the source/drain contact formation to be performed within the same processing system. In some implementations, after the formation of the contact trench, a pre-clean process and a formation of a doped semiconductor layer on the source/drain region are performed. The doped semiconductor layer has a higher dopant concentration than that of the source/drain region, and higher dopant concentration leads to decreased contact resistance.

While the foregoing is directed to implementations of the present disclosure, other and further implementations of the disclosure may be devised without departing from the basic scope thereof, and the scope thereof is determined by the claims that follow.

What is claimed is:

1. A method for forming a contact, the method comprising:
   forming a trench in a dielectric material to expose a source/drain region;
   performing a pre-clean process on the source/drain region and the dielectric material;
   forming a doped semiconductor layer on the source/drain region, wherein the doped semiconductor layer has a lower electrical resistance than the source/drain region;
   forming a metal silicide layer on the doped semiconductor layer;
   filling the trench with a conductor;
   forming a cap layer on the metal silicide layer;
   disposing the conductor on the cap layer; and
   disposing a contact etch stop layer on a portion of the source/drain region.

2. The method of claim 1, wherein the doped semiconductor layer comprises doped silicon, doped germanium, doped silicon-germanium, or doped group III/V compound semiconductors, and the doped semiconductor layer is formed by a selective epitaxial deposition process.

3. The method of claim 2, wherein the metal silicide layer comprises titanium silicide, cobalt silicide, or ruthenium silicide, and the metal silicide layer is formed by a selective epitaxial deposition process.

4. The method of claim 3, wherein the cap layer comprises titanium nitride, silicon nitride, aluminum oxide, hafnium oxide, zirconium oxide, or manganese oxide, and the cap layer is formed by an atomic layer deposition process.

5. The method of claim 4, wherein the conductor comprises a metal.

6. A semiconductor device comprising:
   a source/drain region extending between dielectric material and from a semiconductor structure;

a doped semiconductor layer disposed on a first portion of the source/drain region;

a metal silicide layer disposed on the doped semiconductor layer;

a conductor filled in a trench, wherein the trench is formed in a dielectric material to expose the source/drain region;

a cap layer disposed on the metal silicide layer and the dielectric material;

a conductor disposed on the cap layer; and a contact etch stop layer disposed on a second portion of the source/drain region.

7. The semiconductor device of claim 6, wherein the contact etch stop layer comprises silicon nitride, silicon oxynitride, silicon carbon nitride, or a combination thereof.

8. The semiconductor device of claim 6, wherein the source/drain region comprises silicon, germanium, silicon-germanium, or group III/V compound semiconductors.

9. The semiconductor device of claim 8, wherein the semiconductor structure comprises silicon, germanium, silicon-germanium, or group III/V compound semiconductors.

10. The semiconductor device of claim 9, wherein the doped semiconductor layer comprises doped silicon, doped germanium, doped silicon-germanium, or doped group III/V compound semiconductors, and the doped semiconductor layer is formed by a selective epitaxial deposition process.

11. The semiconductor device of claim 10, wherein the metal silicide layer comprises titanium silicide, cobalt silicide, or ruthenium silicide.

12. The semiconductor device of claim 11, wherein the cap layer comprises titanium nitride, silicon nitride, aluminum oxide, hafnium oxide, zirconium oxide, or manganese oxide.

13. The semiconductor device of claim 12, wherein the conductor comprises a metal.

* * * * *